(12) United States Patent
Sofue et al.

(10) Patent No.: US 7,511,424 B2
(45) Date of Patent: Mar. 31, 2009

(54) LIGHT EMITTING DEVICE WITH EXCELLENT HEAT RESISTANCE AND LIGHT RESISTANCE

(75) Inventors: Shinsuke Sofue, Anan (JP); Hiroto Tamaki, Anan (JP); Kunihiro Izuno, Anan (JP)

(73) Assignee: Nichia Corporation, Anan-shi (JP)

( * ) Notice: Subject to any disclaimer, the term of this patent is extended or adjusted under 35 U.S.C. 154(b) by 382 days.

(21) Appl. No.: 11/399,474

(22) Filed: Apr. 7, 2006

(65) Prior Publication Data

US 2006/0226774 A1    Oct. 12, 2006

(30) Foreign Application Priority Data

Apr. 8, 2005    (JP) .............................. 2005-112805

(51) Int. Cl.
*H05B 33/00*    (2006.01)
(52) U.S. Cl. ...................................... 313/512; 428/917
(58) Field of Classification Search .................. None
See application file for complete search history.

(56) References Cited

U.S. PATENT DOCUMENTS 5,665,473 A * 9/1997 Okoshi et al. ............... 428/457

| 6,083,661 A | * | 7/2000 | Oaks et al. ............... 430/286.1 |
| 6,777,069 B2 | * | 8/2004 | Ito et al. .................... 428/322.2 |
| 2005/0037201 A1 | * | 2/2005 | Hirai et al. .................... 428/403 |
| 2006/0035092 A1 | | 2/2006 | Shimizu et al. |
| 2006/0234087 A1 | * | 10/2006 | Kumazawa et al. ......... 428/701 |

* cited by examiner

*Primary Examiner*—Ashok Patel
(74) *Attorney, Agent, or Firm*—Westerman, Hattori, Daniels & Adrian, LLP.

(57) ABSTRACT

A light emitting device is provided, including a light emitting element, a package comprised at least partially of metal on which said light emitting element is mounted, and a resin layer coated on said light emitting element. The light emitting element is eutectic bonded to a metal portion of said package, and the resin layer is formed of a cured product of a silicone composition. The composition includes (i) an organopolysiloxane having an average composition formula (1):

$$R^1_a(OX)_b SiO_{(4-a-b)/2} \qquad (1)$$

wherein $R^1$ is an alkyl, alkenyl or aryl group, X is a hydrogen atom, or an alkyl, alkenyl, alkoxyalkyl or acyl group, a is a number from 1.05 to 1.5, b is a number of $0<b<2$, and $1.05<a+b<2$, and (ii) a condensation catalyst. The device exhibits improved heat resistance and light resistance, and also exhibits improved adhesion to the resins and metal members used.

6 Claims, 3 Drawing Sheets

LIGHT EMITTING DEVICE WITH EXCELLENT HEAT RESISTANCE AND LIGHT RESISTANCE

BACKGROUND OF THE INVENTION

1. Field of the Invention

The present invention relates to a light emitting device that can be used in a liquid crystal backlight, an illumination light source, and various types of indicators, displays and traffic signal lights, and relates particularly to a light emitting device with improved levels of heat resistance and light resistance.

2. Description of the Prior Art

In light emitting devices that use a light emitting element such as an LED, the light emitting element is typically coated with a layer comprising a phosphor for converting the wavelength of the light, or an organic resin layer with a high degree of optical transparency that functions as a lens or the like. When current flows through the light emitting element, the element heats up to a temperature of 100° C. to 130° C. Furthermore, light emitting elements that emit blue light or ultraviolet light from the short wavelength region are now being used, meaning resin layers that not only exhibit excellent heat resistance, but also exhibit excellent light resistance to ultraviolet light and the like are now being demanded. Conventionally, epoxy resins have been widely used as the material for the resin layer, but recently, silicone-based resins, which are known to offer excellent ultraviolet light resistance and heat resistance, have started being used.

However, with short wavelength LEDs such as blue LEDs and ultraviolet LEDs now being developed, the resin layer now requires a tougher material that is not only capable of withstanding heat generation, but is also able to withstand this type of high energy, short wavelength light. Previously proposed silicone resins have been addition curable resins that use a hydrosilylation reaction, meaning the proportion of silethylene linkages within the cured product is high. Because silethylene linkages are prone to cleavage by light or heat, the main skeleton within the cured product is prone to deterioration, and the resin is prone to bleed-out of low molecular weight, fluid, oily silicone. As a result, the mechanical strength of the cured product falls, and the resin is more likely to become brittle and prone to heat deformation. Furthermore, the low molecular weight silicone components that bleed out can cause a variety of faults. In addition, if the resin reaches this state, then color irregularities and tone variation are more likely to occur during light emission, meaning the color tone characteristics of the light emitting element may be affected.

Furthermore, conventionally used resins generally exhibit poor adhesion to metal members, and are prone to peeling.

SUMMARY OF THE INVENTION

Accordingly, an object of the present invention is to provide a light emitting device which exhibits improved levels of heat resistance and light resistance, and also exhibits improved adhesion to the resins and metal members used.

In order to achieve the above object, the present invention provides a light emitting device comprising:

a light emitting element, a package comprised at least partially of metal on which said light emitting element is mounted, and a resin layer coated on said light emitting element, wherein said light emitting element is eutectic bonded to a metal portion of said package, and said resin layer comprises a cured product of a composition comprising:

(i) an organopolysiloxane with a polystyrene equivalent weight average molecular weight of at least $5 \times 10^3$, represented by an average composition formula (1):

$$R^1_a(OX)_b SiO_{(4-a-b)/2} \qquad (1)$$

wherein each $R^1$ represents, independently, an alkyl group, alkenyl group or aryl group of 1 to 6 carbon atoms, each X represents, independently, a hydrogen atom, or an alkyl group, alkenyl group, alkoxyalkyl group or acyl group of 1 to 6 carbon atoms, a represents a number within a range from 1.05 to 1.5, b represents a number that satisfies $0<b<2$, and $1.05 < a+b < 2$, and (ii) a condensation catalyst.

A resin layer used in a light emitting device of the present invention is constructed as a phosphor-containing layer or a lens or the like, and because the resin layer exhibits excellent transparency, with almost no light absorption in the region from 300 nm to 800 nm, as well as a small birefringence, it is ideally suited to these applications. In addition, the resin layer also exhibits excellent heat resistance and light resistance, as well as superior toughness, meaning it is resistant to deterioration even when molded directly on top of a light emitting element such as a LED. Moreover, in a light emitting device of the present invention, because the light emitting element is mounted by eutectic bonding to a package at least partially comprised of metal, the heat radiation properties of the device are also favorable. As a result of these characteristics operating in unison, the heat from the light emitting element is not retained, but is rather released externally, meaning the resin undergoes no deterioration, enabling stable and favorable light emission characteristics to be maintained over an extended period.

Furthermore, by using eutectic bonding, the bonding strength is increased and the adhesion between the silicone resin layer and the metal member improves, enabling an improvement in the reliability of the product.

If the resin layer comprises a phosphor, then when the light emitted from the light emitting element is irradiated onto the phosphor, the phosphor absorbs the light and performs a wavelength conversion. As a result, the light emitted from the light emitting element and the light emitted from the phosphor are mixed, enabling the provision of light emitting devices that emit light of all manner of colors, including white light. Furthermore, although heat is generated when the light emitted from the light emitting element is absorbed by the phosphor, this heat is transmitted to the resin layer. At this time, if the heat from the phosphor is retained within the resin, then there is a danger that the resin may deteriorate, but in a light emitting device of the present invention, the heat is transmitted to the metal portion of the package, from where it is radiated externally. As a result, even though the resin contains a phosphor, deterioration of the resin can still be suppressed. Accordingly, a light emitting device of the present invention not only offers extremely simple regulation of color tone, but also exhibits superior reliability and excellent suitability to mass production.

An embodiment in which the light emitting element has a light emission peak wavelength within a range from 360 nm to 550 nm offers additional advantages in that deterioration of the resin can be suppressed even further, and wavelength conversion of the light emitted from the light emitting element can be conducted efficiently. The reason for these improvements is that light with an emission peak wavelength on the short wavelength side at less than 360 nm accelerates the deterioration of the resin, whereas with light with an emission peak on the long wavelength side exceeding 550 nm, the wavelength conversion performed by the phosphor does not occur efficiently.

DETAILED DESCRIPTION OF THE PREFERRED EMBODIMENTS

Figure 1:
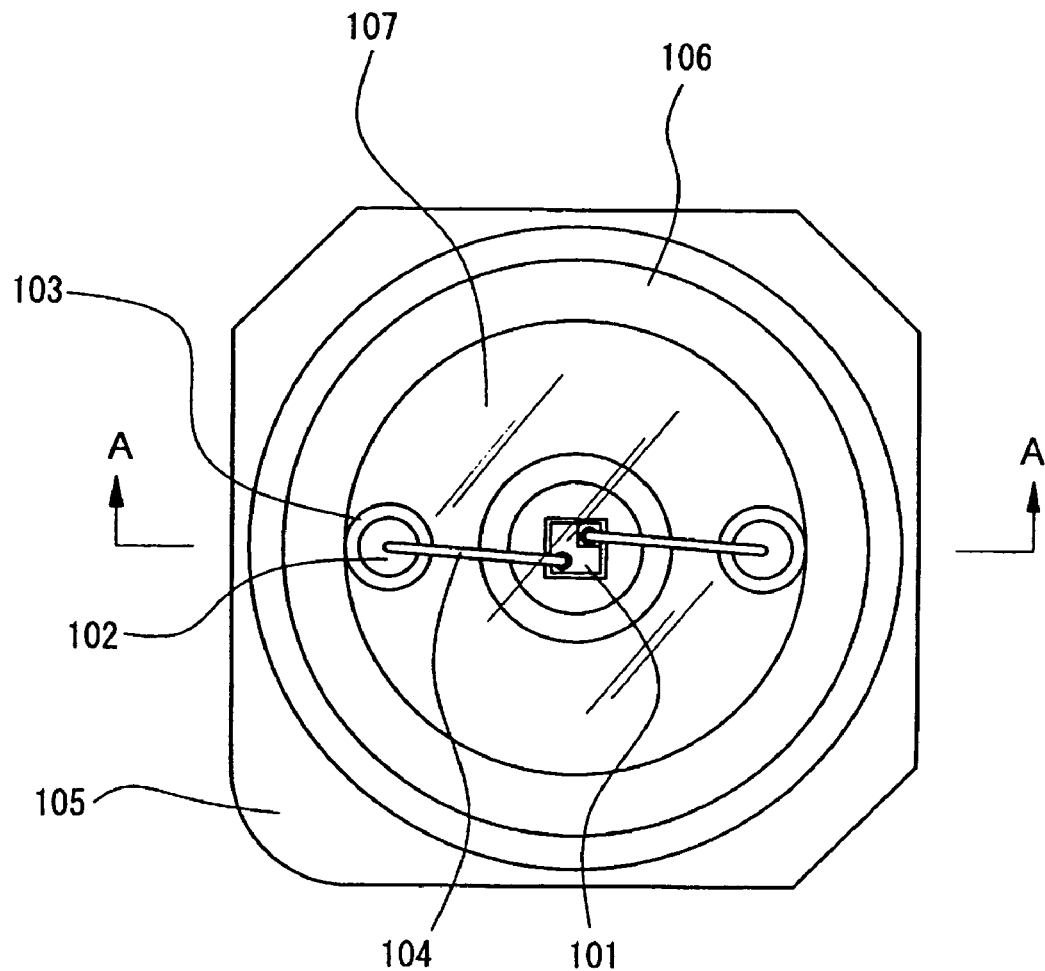
FIG. 1 is a plan view showing an outline of one example of a light emitting device of the present invention.

As follows is a description of the elements and materials and the like used in a light emitting device of the present invention.

[Curable Silicone Resin]

As follows is a more detailed description of the present invention. In this description, unless stated otherwise, room temperature refers to a temperature of 24±2° C. (that is, 22 to 26° C.).

[(i) Organopolysiloxane]

The component (i) is an organopolysiloxane with a polystyrene equivalent weight average molecular weight of at least $5 \times 10^3$, represented by an average composition formula (1) shown below.

$$R^1_a(OX)_b SiO_{(4-a-b)/2} \qquad (1)$$

wherein each $R^1$ represents, independently, an alkyl group, alkenyl group or aryl group of 1 to 6 carbon atoms, each X represents, independently, a hydrogen atom, or an alkyl group, alkenyl group, alkoxyalkyl group or acyl group of 1 to 6 carbon atoms, a represents a number within a range from 1.05 to 1.5, b represents a number that satisfies $0 < b < 2$, and $1.05 < a+b < 2$.

In the above formula (1), examples of alkyl groups represented by $R^1$ include a methyl group, ethyl group, propyl group, or butyl group. An example of an alkenyl group is a vinyl group. An example of an aryl group is a phenyl group. Of these, a methyl group or phenyl group is preferred as the $R^1$ group.

In the above formula (1), examples of suitable alkyl groups represented by X include a methyl group, ethyl group, propyl group, isopropyl group, butyl group, or isobutyl group. An example of a suitable alkenyl group is a vinyl group. Examples of suitable alkoxyalkyl groups include a methoxyethyl group, ethoxyethyl group, or butoxyethyl group. Examples of suitable acyl groups include an acetyl group or propionyl group. Of these, a hydrogen atom, methyl group or isobutyl group is preferred as the X group.

In the above formula, a is preferably a number within a range from 1.15 to 1.25, and b is preferably a number that satisfies $0.01 < b < 1.4$, and even more preferably $0.02 < b < 1.0$, and most preferably $0.05 < b < 0.3$. If the value of a is less than 1.05, then cracks are more likely to form in the cured coating, whereas if the value exceeds 1.5, the cured coating loses toughness, and is prone to becoming brittle. If b is zero, then the adhesiveness relative to substrates deteriorates, whereas if b is 2 or greater, a cured coating may be unobtainable. Furthermore, the value of a+b preferably satisfies $1.06 < a+b < 1.8$, and even more preferably $1.1 < a+b < 1.7$.

Furthermore, in order to ensure a more superior level of thermal resistance for the obtained cured product, the (mass referenced) proportion of $R^1$ typically represented by methyl groups within the organopolysiloxane of this component is preferably reduced, and specifically, is preferably restricted to no more than 32% by mass.

The organopolysiloxane of this component can be produced either by hydrolysis-condensation of a silane compound represented by a general formula (2) shown below:

$$SiR^2_c(OR^3)_{4-c} \qquad (2)$$

wherein each $R^2$ represents, independently, a group as defined above for $R^1$, each $R^3$ represents, independently, a group as defined above for X, and c represents an integer of 1 to 3, or by cohydrolysis-condensation of a silane compound represented by the above general formula (2), and an alkyl silicate represented by a general formula (3) shown below:

$$Si(OR^3) \qquad (3)$$

wherein each $R^3$ represents, independently, a group as defined above, and/or a condensation polymerization product of the alkyl silicate (an alkyl polysilicate). Both the silane compound and the alkyl (poly)silicate may be used either alone, or in combinations of two or more different materials.

Examples of the silane compound represented by the above formula (2) include methyltrimethoxysilane, methyltriethoxysilane, ethyltrimethoxysilane, ethyltriethoxysilane, phenyltrimethoxysilane, phenyltriethoxysilane, dimethyldimethoxysilane, dimethyldiethoxysilane, diphenyldimethoxysilane, diphenyldiethoxysilane, methylphenyldimethoxysilane and methylphenyldiethoxysilane, and of these, methyltrimethoxysilane is preferred. These silane compounds may be used either alone, or in combinations of two or more different compounds.

Examples of the alkyl silicate represented by the above formula (3) include tetraalkoxysilanes such as tetramethoxysilane, tetraethoxysilane and tetraisopropyloxysilane, and examples of the condensation polymerization product of the alkyl silicate (the alkyl polysilicate) include methyl polysilicate and ethyl polysilicate. These alkyl (poly)silicates may be used either alone, or in combinations of two or more different materials.

Of these possibilities, the organopolysiloxane of this component is preferably formed from 50 to 95 mol % of an alkyltrialkoxysilane such as methyltrimethoxysilane, and 50 to 5 mol % of a dialkyldialkoxysilane such as dimethyldimethoxysilane, as such a composition ensures superior levels of crack resistance and thermal resistance in the resulting cured product. Organopolysiloxanes formed from 75 to 85 mol % of an alkyltrialkoxysilane such as methyltrimethoxysilane, and 25 to 15 mol % of a dialkyldialkoxysilane such as dimethyldimethoxysilane are even more desirable.

In a preferred embodiment of the present invention, the organopolysiloxane of this component can be obtained either by hydrolysis-condensation of the silane compound described above, or by cohydrolysis-condensation of the silane compound and an alkyl (poly)silicate, and although there are no particular restrictions on the method used for the reaction, the conditions described below represent one example of a suitable method.

The above silane compound and alkyl (poly)silicate are preferably dissolved in an organic solvent such as an alcohol, ketone, ester, cellosolve or aromatic compound prior to use. Specific examples of preferred solvents include alcohols such as methanol, ethanol, isopropyl alcohol, isobutyl alcohol, n-butanol and 2-butanol, and of these, isobutyl alcohol is particularly preferred, as it produces superior levels of curability for the resulting composition, and excellent toughness of the cured product.

In addition, the above silane compound and alkyl (poly) silicate preferably undergo hydrolysis-condensation in the presence of an acid catalyst such as acetic acid, hydrochloric acid, or sulfuric acid. The quantity of water added during the hydrolysis-condensation is typically within a range from 0.9 to 1.5 mols, and preferably from 1.0 to 1.2 mols, relative to each mol of the combined quantity of alkoxy groups within the silane compound and the alkyl (poly)silicate. If this blend quantity falls within the range from 0.9 to 1.5 mols, then the resulting composition exhibits excellent workability, and the cured product exhibits excellent toughness.

The polystyrene equivalent weight average molecular weight of the organopolysiloxane of this component is preferably set, using aging, to a molecular weight just below the level that results in gelling, and from the viewpoints of ease of handling and pot life, must be at least $5 \times 10_3$, and preferably within a range from least $5 \times 10^3$ to $3 \times 10^{6,}$ and even more preferably from $1 \times 10^4$ to $1 \times 10^5$. If this molecular weight is less than $5 \times 10^3$, then the composition is prone to cracking on curing. If the molecular weight is too large, then the composition becomes prone to gelling, and the workability deteriorates.

The temperature for conducting the aging described above is preferably within a range from 0 to 40° C., and is even more preferably room temperature. If the aging temperature is from 0 to 40° C., then the organopolysiloxane of this component develops a ladder-type structure, which provides the resulting cured product with excellent crack resistance.

The organopolysiloxane of his component may use either a single compound, or a combination of two or more different compounds.

[(ii) Condensation Catalyst]

The condensation catalyst of the component (ii) is necessary to enable curing of the organopolysiloxane of the component (i). There are no particular restrictions on the condensation catalyst, although in terms of achieving favorable stability for the organopolysiloxane, and excellent levels of hardness and resistance to yellowing of the resulting cured product, an organometallic catalyst is normally used. Examples of this organometallic catalyst include compounds that contain zinc, aluminum, titanium, tin, or cobalt atoms, and more specifically include organic acid zinc compounds, Lewis acid catalysts, organoaluminum compounds, and organotitanium compounds. Specific examples include zinc octoate, zinc benzoate, zinc p-tert-butylbenzoate, zinc laurate, zinc stearate, aluminum chloride, aluminum perchlorate, aluminum phosphate, aluminum triisopropoxide, aluminum acetylacetonate, aluminum butoxy-bis(ethylacetoacetate), tetrabutyl titanate, tetraisopropyl titanate, tin octoate, cobalt naphthenate, and tin naphthenate, and of these, zinc octoate is preferred.

The blend quantity of the component (ii) is typically within a range from 0.05 to 10 parts by mass per 100 parts by mass of the component (i), although in terms of obtaining a composition with superior levels of curability and stability, a quantity within a range from 0.1 to 5 parts by mass is preferred.

The condensation catalyst of his component may use either a single compound, or a combination of two or more different compounds.

[Other Optional Components]

In addition to the aforementioned component (i) and component (ii), other optional components can also be added to a composition of the present invention, provided such addition does not impair the actions or effects of the present invention. Examples of these other optional components include inorganic fillers, inorganic phosphors, age resistors, radical inhibitors, ultraviolet absorbers, adhesion improvers, flame retardants, surfactants, storage stability improvers, antiozonants, photostabilizers, thickeners, plasticizers, coupling agents, antioxidants, thermal stabilizers, conductivity imparting agents, antistatic agents, radiation blockers, nucleating agents, phosphorus-based peroxide decomposition agents, lubricants, pigments, metal deactivators, physical property modifiers, and organic solvents. These optional components may be used either alone, or in combinations of two or more different materials.

—Inorganic Filler—

Adding an inorganic filler provides a number of effects, including ensuring that the light scattering properties of the cured product and the fluidity of the composition fall within appropriate ranges, and strengthening materials that use the composition. There are no particular restrictions on the type of inorganic filler used, although very fine particulate fillers that do not impair the optical characteristics are preferred, and specific examples include alumina, aluminum hydroxide, fused silica, crystalline silica, ultra fine amorphous silica powder, ultra fine hydrophobic silica powder, talc, calcium carbonate, and barium sulfate.

—Phosphor—

Examples of suitable phosphors include the types of materials that are widely used in LEDs, such as yttrium aluminum garnet (YAG) phosphors, ZnS phosphors, $Y_2O_2S$ phosphors, red light emitting phosphors, blue light emitting phosphors, and green light emitting phosphors. A more detailed description of the most typical phosphors is given below.

First is a description of phosphors based on an yttrium aluminum oxide phosphor activated with cerium which is excited by light emitted from the light emitting element. Specific examples of these yttrium aluminum oxide phosphors include $YAlO_3$:Ce, $Y_3Al_5O_{12}$:Ce (YAG:Ce), $Y4Al_2O_9$:Ce, and mixtures thereof. The yttrium aluminum oxide phosphor may also include one or more of Ba, Sr, Mg, Ca, and Zn. Furthermore, by incorporating Si within the phosphor, the crystal growth reaction can be suppressed, enabling better uniformity of the phosphor particles.

In this description, the term Ce-activated yttrium aluminum oxide phosphor is used in a broad sense, and includes phosphors with a fluorescent effect in which a portion of, or all of, the yttrium has been substituted with one or more elements selected from the group consisting of Lu, Sc, La, Gd, and Sm, or in which a portion of, or all of, the aluminum has been substituted with one or more elements selected from of Ba, Ti, Ga, and In, or in which both yttrium and aluminum have been substituted as described above.

More specific examples include photoluminescent phosphors represented by the general formula $(Y_zGd_{1-z})_3Al_5O_{12}$:Ce wherein $0<z<1$, or the general formula $(Re_{1-a}Sm_a)_3Re'_5O_{12}$:Ce wherein $0<a<1$, $0<b<1$, Re represents one or more elements selected from the group consisting of Y, Gd, La and Sc, and Re' represents one or more elements selected from the group consisting of Al, Ga, and In.

These phosphors have a garnet structure, and are consequently strongly resistant to heat, light, and moisture, and the peak of the excitation spectrum can be set in the vicinity of 450 nm. Furthermore, the emission peak occurs in the vicinity of 580 nm, and the emission spectrum is broad, with the spectrum tail extending as far as 700 nm.

Furthermore, by incorporating Gd (gadolinium) into the crystal structure of a photoluminescent phosphor, the excited light emission efficiency in the longer wavelength region of 460 nm or higher can be increased. By increasing the Gd content, the emission peak wavelength shifts to a longer wavelength, and the overall light emission spectrum also shifts to a longer wavelength. In other words, in those cases where a strongly red colored light is required, this can be achieved by increasing the quantity of Gd substitution. On the other hand, as the quantity of Gd increases, the emission luminance of blue colored photoluminescence tends to decrease. In addition, if required, other elements such as Th, Cu, Ag, Au, Fe, Cr, Nd, Dy, Co, Ni, Ti, and Eu can also be included as well as the Ce.

Moreover, within the composition of an yttrium aluminum garnet phosphor having a garnet structure, by substituting a portion of the Al with Ga, the light emission wavelength can be shifted to a shorter wavelength. Furthermore, by substituting a portion of the Y within the composition with Gd, the light emission wavelength can be shifted to a longer wavelength.

In those cases where a portion of Y is substituted with Gd, the Gd substitution is preferably less than 10%, and the Ce content (degree of substitution) is preferably set within a range from 0.03 to 1.0. At Gd substitution values of 20% or less, the green component is large and the red component is reduced, but by increasing the Ce content, the red component can be supplemented, meaning the desired color tone can be obtained with no reduction in luminance. By using this type of composition, the temperature characteristics become more favorable, and the reliability of the light emitting diode can be improved. Furthermore, by using a photoluminescent phosphor that has been adjusted so as to increase the red component, a light emitting device can be formed that is capable of emitting intermediate colors such as pink or the like.

These types of photoluminescent phosphors use either oxides or compounds that can be readily converted to oxides at high temperatures as the raw materials for Y, Gd, Al, and Ce, and these compounds are mixed together thoroughly in a stoichiometric ratio to obtain the raw material. Alternatively, a coprecipitated oxide, which is obtained by using oxalic acid to coprecipitate a solution comprising the rare earth elements Y, Gd, and Ce dissolved in a stoichiometric ratio within an acid and then firing the thus formed coprecipitate, can be mixed with aluminum oxide, yielding a raw material mixture. A suitable quantity of a fluoride such as barium fluoride or aluminum fluoride is then mixed into the raw material as a flux, the mixture is placed in a crucible and fired in air at a temperature within a range from 1350° C. to 1450° C. for a period of 2 to 5 hours to form a calcined product, and the calcined product is subsequently ball-milled in water, and then washed, separated, dried and finally passed through a sieve to obtain the final product.

This type of photoluminescent phosphor may also use a mixture of two or more different cerium-activated yttrium aluminum garnet phosphors, or other phosphors.

Furthermore, the particle diameter of the phosphor is preferably within a range from 1 μm to 50 μm, and is even more preferably from 3 μm to 30 μm. Phosphors with a particle diameter of less than 3 μm are comparatively prone to the formation of aggregates, and are also prone to thickening and sedimentation within the liquid resin, which causes a reduction in the light transmission efficiency. By ensuring a particle diameter within the above range, this type of light shielding caused by the phosphor can be suppressed, and the output of the light emitting device can be improved. Furthermore, phosphors with particle diameters in the above range also exhibit high levels of light absorption and conversion efficiency, and offer a broader range of excitation wavelengths. In this manner, by incorporating a large particle diameter phosphor with superior optical characteristics, light within the vicinity of the predominant wavelength of the light emitting element can be favorably converted and emitted.

In this description, the particle diameter refers to the value obtained using a volume-based particle size distribution curve. This volume-based particle size distribution curve is obtained by measuring the particle size distribution by a laser diffraction and scattering method, and more specifically, is obtained by dispersing each substance in an aqueous solution of sodium hexametaphosphate of concentration 0.05%, and then using a laser diffraction particle size distribution analyzer (SALD-2000A) to measure across a particle size range from 0.03 μm to 700 μm under an atmosphere at an air temperature of 25° C. and a humidity of 70%. The central particle diameter value for the phosphor used in the aforementioned composition, which represents the particle diameter value at the point where the integrated value of the volume-based particle size distribution curve reaches 50%, preferably falls within a range from 3 μm to 30 μm. Furthermore, phosphor particles having this central particle diameter value are preferably included in the composition at a high frequency, and this frequency value is preferably within a range from 20% to 50%. In this manner, by using a phosphor with a small variation in the particle diameter, the variation in chromaticity between individual products can be reduced, and light emitting devices with favorable color tone can be produced.

The phosphor is preferably dispersed uniformly throughout the resin layer, but may also be precipitated out within the resin layer.

Furthermore, the present invention is not restricted to the YAG phosphors described above, and a variety of other phosphors can also be used. Examples of suitable other phosphors include $M_2Si_5N_8$:Eu (wherein, M represents an alkaline earth metal such as Ca, Sr, or Ba), $MSi_2O_2N_2$:Eu (wherein, M represents an alkaline earth metal such as Ca, Sr, or Ba), $La_2O_2S$:Eu, $SrAl_2O_4$:R, and $M_5(PO_4)_3X$:R (wherein, M represents one or more elements selected from Sr, Ca, Ba, Mg, and Zn, X represents one or more elements selected from F, Cl, Br, and I, and R represents one or more of Eu, Mn, and a combination of Eu and Mn).

Alkaline earth metal silicates that have been activated with europium can also be included as alternative phosphors. These alkaline earth metal silicates are preferably alkaline earth metal orthosilicates represented by the types of general formulas shown below.

$$(2-x-y)SrO \cdot x(Ba,Ca)O \cdot (1-a-b-c-d)$$
$$SiO_2 \cdot aP_2O_5 bAl_2O_3 cB_2O_3 dGeO_2 :yEu^{2+}$$

wherein $0<x<1.6, 0.005<y<0.5, 0<a,b,c,d<0.5$.

$$(2-x-y)BaO \cdot x(Sr,Ca)O \cdot (1-a-b-c-d)$$
$$SiO_2 \cdot aP_2O_5 bAl_2O_3 cB_2O_3 dGeO_2 :yEu^{2+}$$

wherein $0.01<x<1.6, 0.005<y<0.5, 0<a,b,c,d<0.5$.

Here, at least one of a, b, c, and d preferably has a value that exceeds 0.01.

In addition to the alkaline earth metal silicates described above, other phosphors comprising alkaline earth metal salts include europium and/or manganese-activated alkaline earth metal aluminates, Y(V,P,Si)O$_4$:Eu, or alkaline earth metal-magnesium-disilicates represented by the formula below.

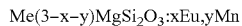

Me(3−x−y)MgSi$_2$O$_3$:xEu,yMn (wherein, 0.005<x<0.5, 0.005<y<0.5, and Me represents Ba and/or Sr and/or Ca)

Phosphors comprising the aforementioned alkaline earth metal silicates are produced in the manner described below. Namely, the starting material alkaline earth metal carbonate, silicon dioxide, and europium oxide are mixed together thoroughly in the stoichiometric ratio corresponding with the desired composition for the target alkaline earth metal silicate, and a typical solid-state reaction used in the production of phosphors is conducted under a reducing atmosphere, converting the mixture to the desired phosphor at a temperature of 1100° C. and 1400° C. During the reaction, a quantity of less than 0.2 mols of either ammonium chloride or some other halide is preferably added. Furthermore, if required, a portion of the silicon can be substituted with germanium, boron, aluminum, or phosphorus, and a portion of the europium can be substituted with manganese.

By combining the types of phosphors described above, that is, one or more phosphors selected from europium and/or manganese-activated alkaline earth metal aluminates Y(V,P,Si)O$_4$:Eu, and Y$_2$O$_2$S:Eu$^{3+}$, phosphors with the desired color temperature and a high degree of color reproducibility can be obtained.

The blend quantity of the phosphor can be adjusted appropriately in accordance with the desired color tone.

—Diffusion Agent—

A diffusion agent is an example of an optional component that may also be added to the aforementioned curable silicone resin. Including a diffusion agent enables various effects to be obtained, including a light diffusion effect, a thickening effect, and a stress diffusion effect. Specific examples of favorable diffusion agents include barium titanate, titanium oxide, aluminum oxide, and silicon oxide. By using these diffusion agents, a light emitting device with a favorable directional pattern can be obtained. The diffusion agent preferably has a central particle diameter of at least 1 nm and less than 5 μm. Diffusion agents with a central particle diameter of approximately 400 nm or greater cause favorable scattering of the light emitted from the light emitting element and the phosphor, and are able to suppress the type of color irregularities that become increasingly likely when phosphors with large particle diameters are used. On the other hand, diffusion agents with a central particle diameter of less than approximately 400 nm have a minimal interference effect on the wavelength of the light emitted from the light emitting element, meaning they offer excellent transparency, and can be used to increase the resin viscosity without lowering the luminance. As a result, in those cases where a color conversion member is positioned by potting or the like, the phosphor within the resin composition can be dispersed substantially uniformly inside the syringe, and that state of uniform dispersion can be maintained, meaning production can be conducted with a favorable yield, even if the phosphor has a large particle diameter and exhibits comparatively poor handling characteristics. In this manner, because the effect of the diffusion agent varies depending on the particle diameter range, the diffusion agents are preferably selected or combined in accordance with the method being used.

[Preparation of Composition and Cured Product]

Said composition can be prepared by mixing together the component (i), the component (ii), and any optional components that are to be added, using any arbitrary mixing method. Specifically, the organopolysiloxane of the component (i), the condensation catalyst of the component (ii), and any optional components are normally placed in a commercially available mixer (such as a Thinky Conditioning Mixer, manufactured by Kabushiki Kaisha Thinky), and the composition of the present invention is then prepared by mixing the components uniformly for approximately 1 to 5 minutes to produce a mixture.

Said composition may be formed into a film in neat form, or may also be dissolved in an organic solvent to generate a varnish. There are no particular restrictions on the organic solvent used, although a solvent with a boiling point of at least 64° C. is preferred, and specific examples of suitable solvents include hydrocarbon-based solvents such as benzene, toluene, and xylene; ether-based solvents such as tetrahydrofuran, 1,4-dioxane, and diethyl ether; ketone-based solvents such as methyl ethyl ketone; halogen-based solvents such as chloroform, methylene chloride, and 1,2-dichloroethane; alcohol-based solvents such as methanol, ethanol, isopropyl alcohol, and isobutyl alcohol; as well as octamethylcyclotetrasiloxane and hexamethyldisiloxane, and of these, xylene and isobutyl alcohol are preferred. The organic solvent may use either a single compound, or a combination of two or more different solvents.

There are no particular restrictions on the blend quantity of the organic solvent, although a quantity that results in a concentration for the organopolysiloxane of the component (i) of at least 30% by mass, and even more preferably 40% by mass or higher, is desirable, as such a quantity simplifies the processing required to produce a typical thickness for the cured product within a range from 10 μm to 3 mm, and even more typically from 100 μm to 3 mm.

Furthermore, when curing the composition, a step cure process is preferably conducted across a range from 80 to 200° C. For example, the composition is preferably first subjected to low temperature curing at 80° C. for 1 hour, subsequently heat cured at 150° C. for a further 1 hour, and then heat cured at 200° C. for 8 hours. By using step curing with these stages, the composition exhibits superior curability, and the occurrence of foaming can be suppressed to a suitable level.

The glass transition temperature (Tg) of the cured product obtained by curing the composition is usually too high to enable measurement using a commercially available measuring device (for example, the thermomechanical tester (brand name: TM-7000) manufactured by Shinku Riko Co., Ltd. has a measurement range from 25 to 200° C.), indicating that the obtained cured product exhibits an extremely high level of thermal resistance.

[Light Emitting Element]

There are no particular restrictions on the light emitting element in the present invention, which is not restricted to light emitting elements that emit in the red or green regions, but can also use a light emitting element that emits in the blue region. Moreover, the present invention is not restricted to these types of light emitting elements that emit in the visible spectrum, but can also use light emitting elements that emit in the ultraviolet region to the short wavelength side of visible light, such as light emitting elements that emit light in the ultraviolet region in the vicinity of 360 nm. In those cases where a phosphor is used in the light emitting device, a semiconductor light emitting element having a light emitting layer that is able to emit light with a wavelength that is capable of excitation of the phosphor is preferred. Examples of this type of semiconductor light emitting element include various semiconductors such as ZnSe and GaN, although nitride semiconductors ($In_xAl_yGa_{1-X-Y}N$, wherein 0<X, 0<Y, and X+Y<1) capable of emitting short wavelengths that can effect efficient excitation of the phosphor are preferred. Furthermore, if desired, boron or phosphorus can also be incorporated within the above nitride semiconductors. Examples of the structure of the semiconductor include a homostructure, heterostructure or double heterostructure containing an MIS junction, PIN junction or pn junction. A variety of light emission wavelengths can be selected depending on the materials used, and the degree of crystal mixing within the semiconductor layer. Furthermore, the semiconductor active layer may also be a single quantum well structure or a multi-quantum well structure, formed as a thin film in which a quantum effect occurs.

In those cases where a nitride semiconductor is used, a material such as sapphire, spinel, SiC, Si, ZnO, or GaN is preferably used as the semiconductor substrate. In order to enable the formation of nitride semiconductors of favorable crystallinity that are able to be mass produced, the use of a sapphire substrate is preferred. A nitride semiconductor can be formed on top of the sapphire substrate using a MOCVD method or the like. A buffer layer, such as a layer of GaN, AlN, or GaAlN is formed on the sapphire substrate, and a nitride semiconductor having a pn junction can then be formed on top of the buffer layer.

Examples of light emitting elements having a pn junction using a nitride semiconductor include a double heterostructure wherein a first contact layer formed with n-type gallium nitride, a first cladding layer formed with n-type aluminum gallium nitride, an active layer formed with indium gallium nitride, a second cladding layer formed with p-type aluminum gallium nitride, and a second contact layer formed with p-type gallium nitride, are laminated sequentially on top of a buffer layer.

Nitride semiconductors exhibit n-type conductivity when not doped with impurities. In order to form an n-type nitride semiconductor having the desired properties, by improving the light emission efficiency or the like, an n-type dopant such as Si, Ge, Se, Te, or C is preferably introduced into the semiconductor. On the other hand, in order to form a p-type nitride semiconductor, a p-type dopant such as Zn, Mg, Be, Ca, Sr, or Ba is used to dope the semiconductor. Because a nitride semiconductor is not easily converted to a p-type semiconductor simply by doping with a p-type dopant, following introduction of the p-type dopant, the doped semiconductor is preferably subjected to a resistance lowering treatment such as heating in a furnace or irradiation with a plasma. Following formation of the electrodes, light emitting elements comprising the nitride semiconductor can be formed by cutting chips from the semiconductor wafer.

In order to enable the emission of white light from a light emitting device, taking due consideration of factors such as the complementary color relationship with the light emission wavelength from the phosphor and deterioration of the translucent resin, the wavelength of the light emitted from the light emitting element is preferably at least 400 nm but no more than 530 nm, and is even more preferably at least 420 nm but no more than 490 nm. In order to enable further improvements in the excitation and light emission efficiency of the light emitting element and the phosphor, wavelengths of at least 450 nm but no more than 475 nm are particularly desirable.

As follows is a more detailed description of a light emitting device of the present invention, based on an embodiment shown in the drawings. In this embodiment, the light emitting device comprises an LED as the light emitting element, which is flip-chip mounted via a sub-mount, with the structure then sealed in an airtight manner by a glass lid that also functions as a glass lens, but this is merely one example, and the light emitting device of the present invention is in no way limited to this embodiment. Other possible structure types include ceramic packages having metal wiring, resin packages having metal members such as lead electrodes, bullet-type light emitting devices having a lead frame with a recessed portion, and non-airtight light emitting devices in which the resin is coated with a further coating, but regardless of the structure type, the desired effects can be achieved by providing a resin layer generated by coating the light emitting element with an aforementioned curable silicone resin composition and then curing the composition.

<Formation of the Resin Layer>

There are no particular restrictions on the method used for applying the curable silicone resin composition to the light emitting element, and suitable methods include screen printing, metal mask printing, potting, spray application and inkjet application. Depending on the application method used, the composition may either be a solventless composition as described above, or a varnish in which the composition has been diluted with an organic solvent. The thickness of the resin layer can be selected in accordance with the purpose of the resin layer, but as described above, is typically within a range from 10 μm to 3 mm, and even more typically from 100 μm to 3 mm.

[Package]

A package that is used in the present invention, one example of which is shown in the appended drawings, is comprised at least partially of a metal. In other words, at least the portion where the light emitting element is eutectic bonded must be formed of metal, although the entire package may also be formed of metal. Examples of metal materials that can be used include cobalt-nickel-silver alloy, a copper substrate that has been plated with silver, and a substrate comprising either a synthetic resin such as a polyamide-based resin or epoxy resin, or a ceramic, that has been plated with silver. If a material comprising a silver plated surface is used as the package, then the light emitted from a GaN-based compound, which emits light in the visible region, and particularly blue light, is reflected, enabling the light to be emitted externally with a favorable level of efficiency. The use of gold or tin die-bonding members can also contribute to achieving the same effect.

[Eutectic Bonding]

The eutectic bonding of the light emitting element to the metal portion of the package is preferably conducted with gold-tin, silver-tin, Sn—Sb, Sn—Cu, Sn—Ag, or Sn—Ag—Cu or the like, and more preferably conducted with gold-tin. The gold-tin weight ratio is preferably in a range of from 7:3 to 9:1, most preferably 8:2.

EMBODIMENT

As follows is a description of specifics regarding the structure of a light emitting device of the present invention, based on the embodiment shown in the drawings.

Figure 2:
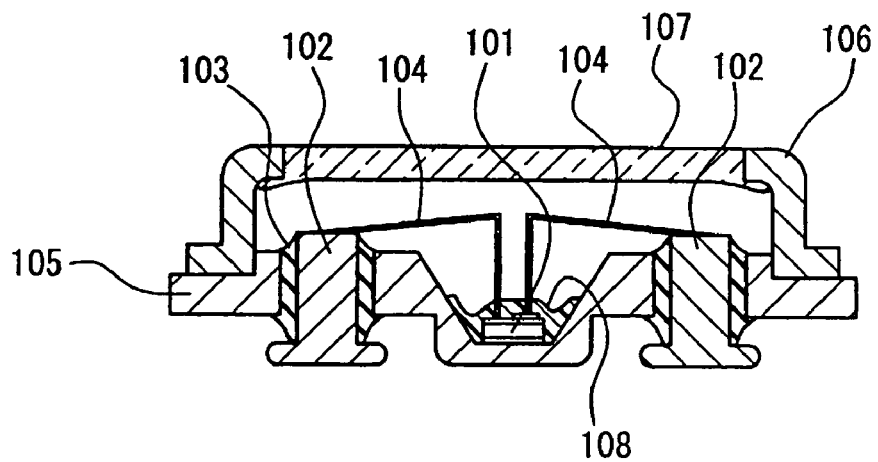
FIG. 2 is a longitudinal sectional view of the device shown in FIG. 1, viewed substantially along a line A-A.
Figure 3:
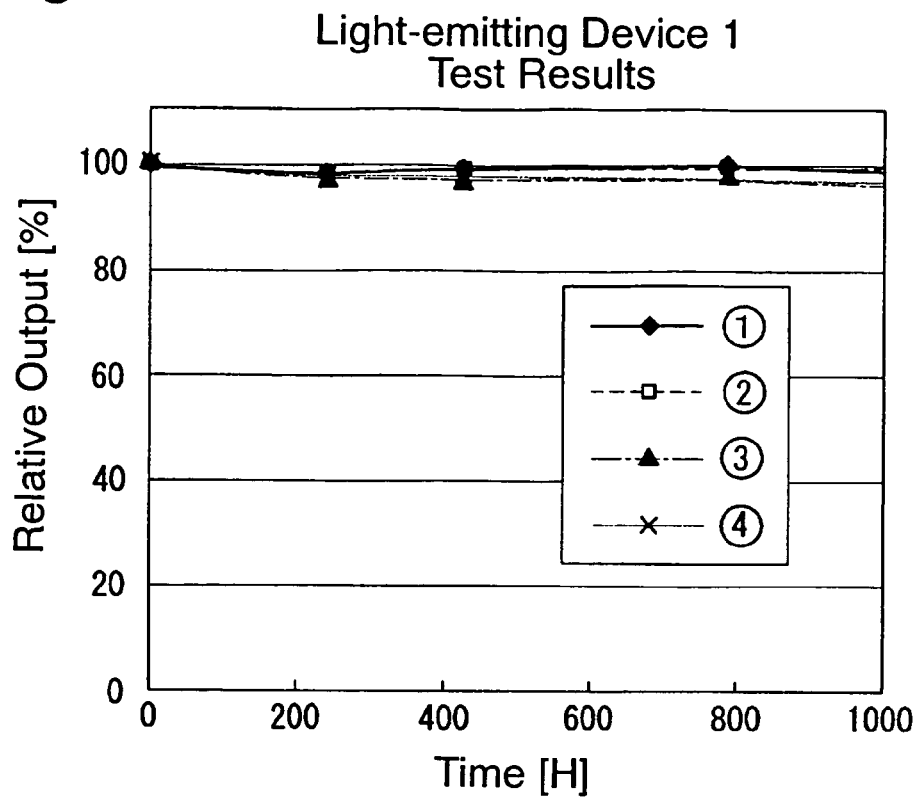
FIG. 3 is a graph showing the results of a reliability test for light emitting devices 1 of Example 7.
Figure 4:
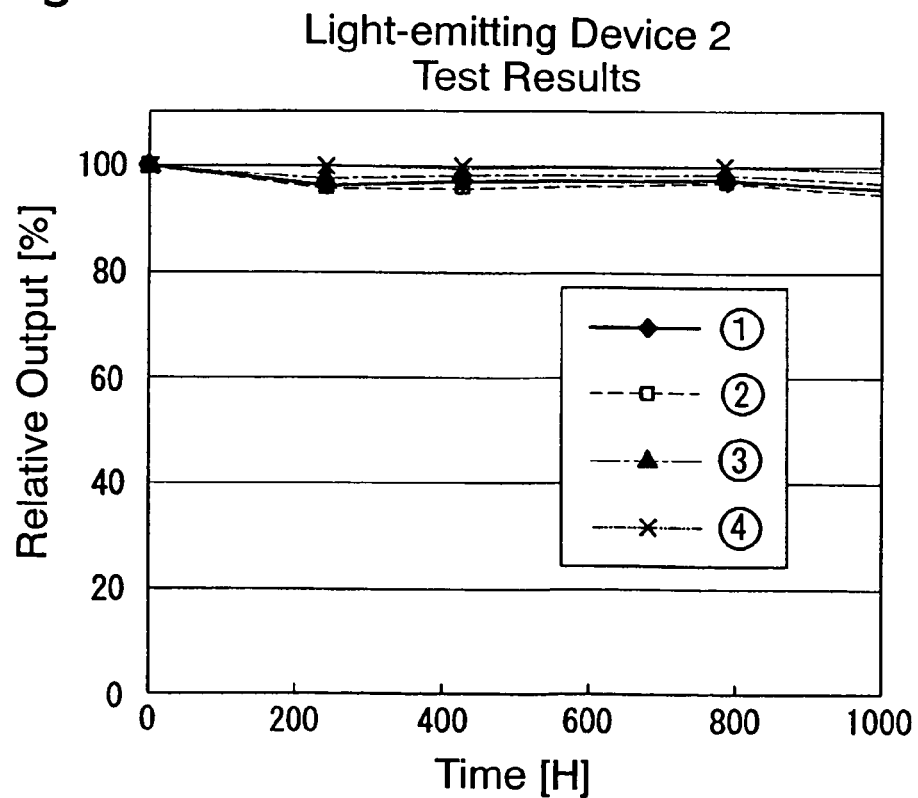
FIG. 4 is a graph showing the results of a reliability test for light emitting devices 2 of Example 8.
Figure 5:
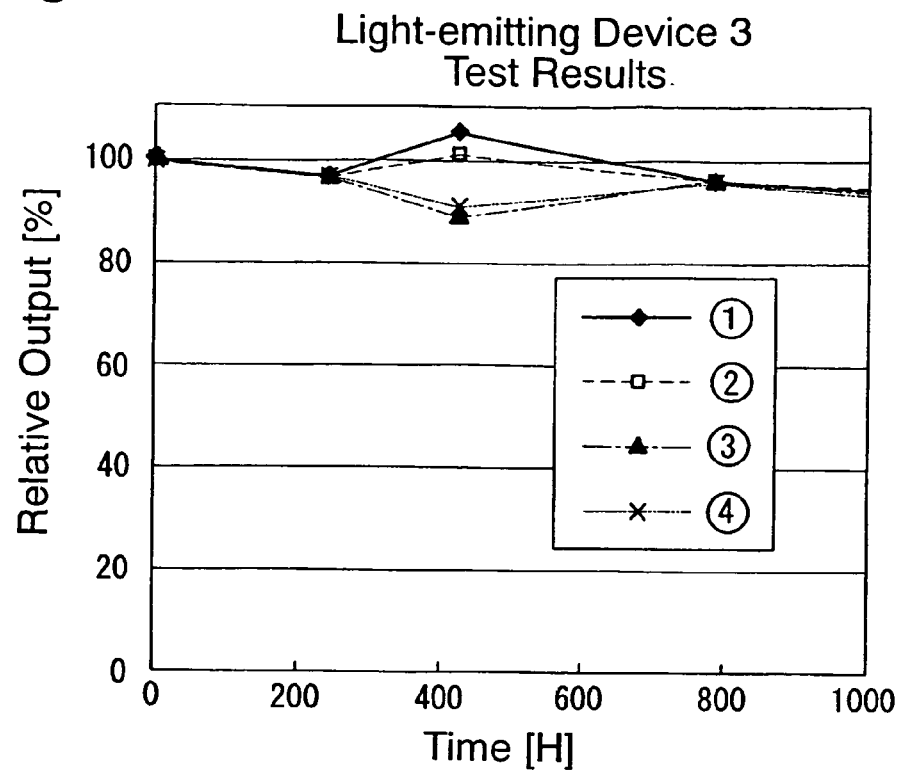
FIG. 5 is a graph showing the results of a reliability test for light emitting devices 3 of Example 9.
Figure 6:
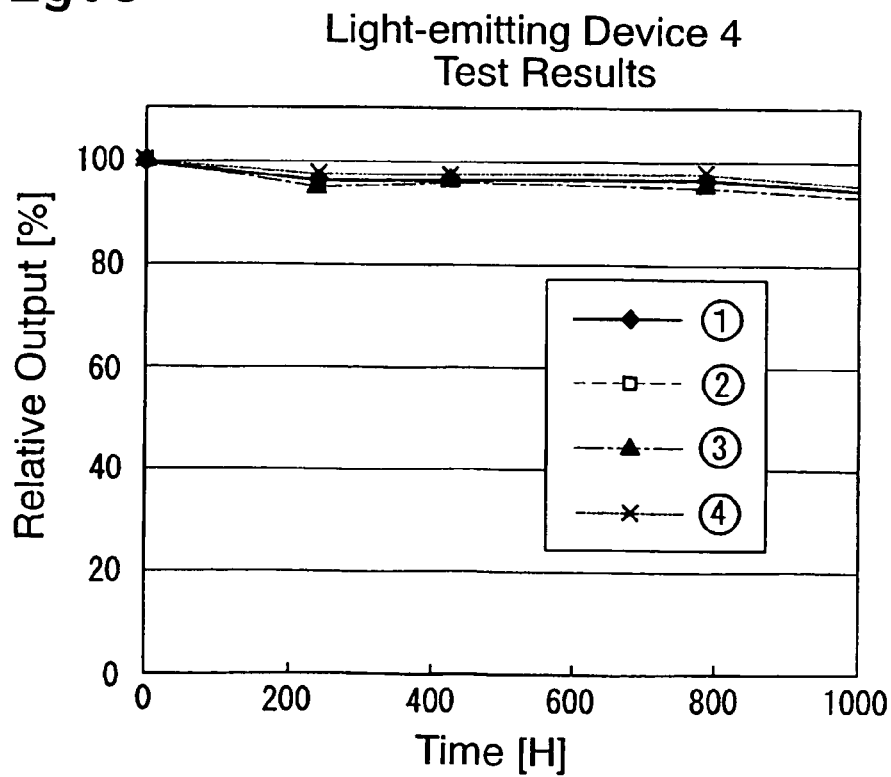
FIG. 6 is a graph showing the results of a reliability test for light emitting devices 4 of Example 10.

FIG. 1 is a plan view showing an outline of a light emitting device, FIG. 2 is a longitudinal sectional view of the same device along a cross section substantially along the line A-A, that is, along the two wires 104.

A light emitting device according to this embodiment forms a surface mounted light emitting device, but this is merely an example, and other types of light emitting device such as a bullet-type device are also possible. A light emitting element 101 can use an ultraviolet light excited nitride semiconductor light emitting element. Furthermore, the light emitting element 101 can also use a blue light excited nitride semiconductor light emitting element. This description assumes an ultraviolet light excited light emitting element 101. The light emitting element 101 uses a nitride semiconductor light emitting element containing a InGaN semiconductor with a light emission peak wavelength of approximately 370 nm as the light emitting layer. To describe the element structure of the LED in more detail, an n-type GaN layer of an undoped nitride semiconductor, a Si-doped GaN layer that represents an n-type contact layer and includes an n-type electrode formed thereon, an n-type GaN layer of an undoped nitride semiconductor, an n-type AlGaN layer of a nitride semiconductor, and then a InGaN layer single quantum well structure that functions as the light emitting layer are formed on top of a sapphire substrate. An AlGaN layer as a Mg-doped p-type cladding layer, and a GaN layer as a Mg-doped p-type contact layer are then laminated sequentially on top of the light emitting layer. (The GaN layer is formed on the sapphire substrate at low temperature and acts as a buffer layer. Furthermore, the p-type semiconductor is annealed at a temperature of at least 400° C. following film formation.) Etching is used to expose the surfaces of the p and n contact layers on the same surface of the nitride semiconductor on the sapphire substrate. An n-electrode is then formed in a belt shape on top of the exposed n-type contact layer, a translucent p-electrode formed of a thin metal film is formed on substantially the entire remaining surface of the p-type contact layer, and a seat electrode is then formed on top of the translucent p-electrode and in parallel with the n-electrode using a sputtering method.

Next, a kovar package 105, comprising a base portion having a recessed portion in the center, and kovar lead electrodes 102 inserted and secured in an airtight and insulated manner in opposing positions at the outside edges of the recessed portion is used. A Ni/Ag layer is provided on the surface of the package 105 and the lead electrodes 102. The light emitting element 101 is eutectic bonded inside the recessed portion of the package 105 using, e.g., Ag—Sn alloy. By using this type of structure, a light emitting device with very good reliability can be obtained even if the light emitted from the light emitting element 101 is in the ultraviolet region or at the short wavelength end of the visible region.

Subsequently, each electrode of the light emitting element 101 is connected electrically with Au wire 104 to the corresponding lead electrode 102. Numeral 103 represents an insulating member.

Next, a resin composition 108 that includes a phosphor such as $BaSi_2O_2N_2$:Eu, $Ca_2Si_5N_8$:Eu or $(Y_{0.8}Gd_{0.2})_3Al_5O_{12}$:Ce or the like is dripped onto, and used to coat the light emitting element 101. The resin composition 108 containing the mixed phosphor undergoes volumetric shrinkage on curing as a portion of the components volatilize.

Following thorough removal of any moisture from inside the package recessed portion, a kovar lid 106 with a glass window portion 107 in the center is then seam welded to seal the structure.

When a light emitting device constructed in this manner emits light, a light emitting diode capable of emitting white light or the like at high luminance can be achieved. Accordingly, a light emitting device can be formed that offers extremely simple control of color tone, as well as excellent suitability for mass production and superior reliability.

EXAMPLES

Synthesis Examples

The methyltrimethoxysilane used in Synthesis Examples is KBM13 (a brand name) manufactured by Shin-Etsu Chemical Co., Ltd., and the dimethyldimethoxysilane is KBM22 (a brand name), also manufactured by Shin-Etsu Chemical Co., Ltd.

Synthesis Example 1

A stirrer and a condenser tube were fitted to a 1 L three-neck flask. This flask was then charged with 109 g (0.8 mols) of methyltrimethoxysilane, 24 g (0.2 mols) of dimethyldimethoxysilane, and 106 g of isobutyl alcohol, and the mixture was cooled in ice with constant stirring. With the temperature inside the reaction system maintained at 0 to 20° C., 60.5 g of 0.05 N hydrochloric acid solution was added dropwise. Following completion of the dropwise addition, the reaction mixture was stirred for 7 hours under reflux at 80° C. Subsequently, the reaction solution was cooled to room temperature, and 150 g of xylene was added to dilute the reaction solution. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and following adjustment of the volatile fraction to 50% by mass, the solution was aged for 12 hours at room temperature, yielding 118 g (including the organic solvent, non-volatile fraction: 50% by mass) of an organopolysiloxane (Polymer 1) with a weight average molecular weight of 21,000, represented by a formula (4) shown below:

$$(CH_3)_{1.2}(OX)_{0.18}SiO_{1.31} \quad (4)$$

wherein X represents a combination of hydrogen atoms, methyl groups, and isobutyl groups.

Synthesis Example 2

A stirrer and a condenser tube were fitted to a 1 L three-neck flask. This flask was then charged with 68.1 g (0.5 mols) of methyltrimethoxysilane, 60.1 g (0.5 mols) of dimethyldimethoxysilane, and 118 g of isobutyl alcohol, and the mixture was cooled in ice with constant stirring. With the temperature inside the reaction system maintained at 0 to 20° C., 54 g of 0.05 N hydrochloric acid solution was added dropwise. Following completion of the dropwise addition, the reaction mixture was stirred for 7 hours under reflux at 80° C. Subsequently, the reaction solution was cooled to room temperature, and 150 g of xylene was added to dilute the reaction solution. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and following adjustment of the volatile fraction to 50% by mass, the solution was aged for 12 hours at room temperature, yielding 109 g (including the organic solvent, non-volatile fraction: 50% by mass) of an organopolysiloxane (Polymer 2) with a weight average molecular weight of 8,500, represented by a formula (5) shown below:

$$(CH_3)_{1.5}(OX)_{0.15}SiO_{1.18} \tag{5}$$

wherein X represents a combination of hydrogen atoms, methyl groups, and isobutyl groups.

Synthesis Example 3

A stirrer and a condenser tube were fitted to a 1 L three-neck flask. This flask was then charged with 115.8 g (0.85 mols) of methyltrimethoxysilane, 18.0 g (0.15 mols) of dimethyldimethoxysilane, and 102 g of isobutyl alcohol, and the mixture was cooled in ice with constant stirring. With the temperature inside the reaction system maintained at 0 to 20° C., 78.3 g of 0.05 N hydrochloric acid solution was added dropwise. Following completion of the dropwise addition, the reaction mixture was stirred for 7 hours under reflux at 80° C. Subsequently, the reaction solution was cooled to room temperature, and 150 g of xylene was added to dilute the reaction solution. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and following adjustment of the volatile fraction to 50% by mass, the solution was aged for an extended period (120 hours) at room temperature, yielding 102 g (including the organic solvent, non-volatile fraction: 50% by mass) of an organopolysiloxane (Polymer 3) with a weight average molecular weight of 120,000, represented by a formula (6) shown below:

$$(CH_3)_{1.15}(OX)_{0.19}SiO_{1.33} \tag{6}$$

wherein X represents a combination of hydrogen atoms, methyl groups, and isobutyl groups.

Synthesis Example 4

A stirrer and a condenser tube were fitted to a 1 L three-neck flask. This flask was then charged with 109 g (0.8 mols) of methyltrimethoxysilane, 24 g (0.2 mols) of dimethyldimethoxysilane, and 106 g of isobutyl alcohol, and the mixture was cooled in ice with constant stirring. With the temperature inside the reaction system maintained at 0 to 20° C., 60.5 g of 0.05 N hydrochloric acid solution was added dropwise. Following completion of the dropwise addition, the reaction mixture was stirred for 7 hours under reflux at 80° C. Subsequently, the reaction solution was cooled to room temperature, and 100 g of hexamethyldisiloxane and 50 g of xylene were added to dilute the reaction solution. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and following adjustment of the volatile fraction to 50% by mass, the solution was aged for 12 hours at room temperature, yielding 113 g (including the organic solvent, non-volatile fraction: 50% by mass) of an organopolysiloxane (Polymer 4) with a weight average molecular weight of 20,500, represented by a formula (7) shown below:

$$(CH_3)_{1.2}(OX)_{0.19}SiO_{1.31} \tag{7}$$

wherein X represents a combination of hydrogen atoms, methyl groups, and isobutyl groups.

Synthesis Example 5

A stirrer and a condenser tube were fitted to a 1 L three-neck flask. This flask was then charged with 27.2 g (0.2 mols) of methyltrimethoxysilane, 96.2 g (0.8 mols) of dimethyldimethoxysilane, and 106 g of isobutyl alcohol, and the mixture was cooled in ice with constant stirring. With the temperature inside the reaction system maintained at 0 to 20° C., 57.1 g of 0.05 N hydrochloric acid solution was added dropwise. Following completion of the dropwise addition, the reaction mixture was stirred for 7 hours under reflux at 80° C. Subsequently, 150 g of xylene was added to dilute the reaction solution. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and the volatile fraction was adjusted to 50% by mass, yielding 94 g (including the organic solvent, non-volatile fraction: 50% by mass) of a polyorganosiloxane (Polymer C1) with a weight average molecular weight of 15,000, represented by a formula (8) shown below:

$$(CH_3)_{1.8}(OX)_{0.11}SiO_{1.05} \tag{8}$$

wherein X represents a combination of hydrogen atoms, methyl groups, and isobutyl groups.

Synthesis Example 6

A stirrer and a condenser tube were fitted to a 1 L three-neck flask. This flask was then charged with 136.2 g (1.0 mols) of methyltrimethoxysilane and 106 g of isobutyl alcohol, and the mixture was cooled in ice with constant stirring. With the temperature inside the reaction system maintained at 0 to 20° C., 81 g of 0.05 N hydrochloric acid solution was added dropwise. Following completion of the dropwise addition, the reaction mixture was stirred for 7 hours under reflux at 80° C. Subsequently, the reaction solution was cooled to room temperature, and 150 g of xylene was added to dilute the reaction solution. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and following adjustment of the volatile fraction to 50% by mass, the solution was aged for 12 hours at room temperature, yielding 103 g (including the organic solvent, non-volatile fraction: 50% by mass) of a polyorganosiloxane (Polymer C2) with a weight average molecular weight of 22,500, represented by a formula (9) shown below:

$$(CH_3)_{1.0}(OX)_{0.21}SiO_{1.40} \tag{9}$$

wherein X represents a combination of hydrogen atoms, methyl groups, and isobutyl groups.

Synthesis Example 7

A stirrer and a condenser tube were fitted to a 1 L three-neck flask. This flask was then charged with 109 g (0.8 mols) of methyltrimethoxysilane, 24 g (0.2 mols) of dimethyldimethoxysilane, and 106 g of isobutyl alcohol, and the mixture was cooled in ice with constant stirring. With the temperature inside the reaction system maintained at 0 to 20° C., 60.5 g of 0.05 N hydrochloric acid solution was added dropwise. Following completion of the dropwise addition, the reaction mixture was stirred for 24 hours at room temperature. Subsequently, 150 g of xylene was added to dilute the reaction solution. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and following adjustment of the volatile fraction to 50% by mass, the solution was aged for 12 hours at room temperature, yielding 109 g (including the organic solvent, non-volatile fraction: 50% by mass) of a polyorganosiloxane (Polymer C3) with a weight average molecular weight of 2,700, represented by a formula (10) shown below:

$$(CH_3)_{1.2}(OX)_{1.16}SiO_{0.82} \quad (10)$$

wherein X represents a combination of hydrogen atoms, methyl groups, and isobutyl groups.

Synthesis Example 8

A stirrer and a condenser tube were fitted to a 1 L three-neck flask. This flask was then charged with 40.9 g (0.3 mols) of methyltrimethoxysilane, 170.8 g (0.7 mols) of diphenyldimethoxysilane, and 106 g of isobutyl alcohol, and the mixture was cooled in ice with constant stirring. With the temperature inside the reaction system maintained at 0 to 20° C., 55.1 g of 0.05 N hydrochloric acid solution was added dropwise. Following completion of the dropwise addition, the reaction mixture was stirred for 7 hours under reflux at 80° C. Subsequently, 150 g of xylene was added to dilute the reaction solution. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and the volatile fraction was adjusted to 50% by mass, yielding 124 g (including the organic solvent, non-volatile fraction: 50% by mass) of a polyorganosiloxane (Polymer C4) with a weight average molecular weight of 13,800, represented by a formula (11) shown below:

$$(CH_3)_{0.3}(C_6H_5)_{1.4}(OX)_{0.12}SiO_{1.09} \quad (11)$$

wherein X represents a combination of hydrogen atoms, methyl groups, and isobutyl groups.

Examples 1 to 6

Examples 1 to 6, Comparative Examples 1 to 4

Compositions were prepared by blending Polymers 1 to 4, and C1 to C4 (including the organic solvent) obtained in Synthesis Examples 1 to 8 with condensation catalysts, in the proportions shown in Table 1. These compositions were cured, and the characteristics (crack resistance, adhesion, UV irradiation resistance test, and thermal resistance) of the resulting cured products were tested and evaluated in accordance with the methods described below. The results are shown in Tables 1 and 2.

Evaluation Methods

—1. Crack Resistance—

Each of the prepared compositions was placed in a Teflon (registered trademark) coated mold of dimensions 50 mm×50 mm×2 mm, subsequently subjected to step curing at 80° C. for 1 hour, 150° C. for 1 hour, and 200° C. for 1 hour, and then post-cured for 8 hours at 200° C., thus yielding a cured film of thickness 1 mm. The cured film was inspected visually for the presence of cracks. If no cracks were visible in the cured film, the crack resistance was evaluated as "good", and was recorded as A, whereas if cracks were detected, the resistance was evaluated as "poor", and was recorded as B. Furthermore, if a cured film was not able to be prepared, a "measurement impossible" evaluation was recorded as C.

—2. Adhesion—

Each of the prepared compositions was applied to a glass substrate using an immersion method, subsequently subjected to step curing at 80° C. for 1 hour, 150° C. for 1 hour, and 200° C. for 1 hour, and then post-cured for 8 hours at 200° C., thus forming a cured product film of thickness 2 to 3 μm on top of the glass substrate. Using a cross-cut adhesion test, the adhesion of the cured product to the glass substrate was investigated. Furthermore, in those cases where cracks had developed in the cured product, making adhesion measurement impossible, the result was recorded in the table as x.

—3. UV Irradiation Resistance Test—

Each of the prepared compositions was dripped onto a glass substrate using a dropper, subsequently subjected to step curing at 80° C. for 1 hour, 150° C. for 1 hour, and 200° C. for 1 hour, and then post-cured for 8 hours at 200° C., thus forming a cured product on top of the glass substrate. This cured product was then irradiated with UV radiation (30 mW) for 24 hours using a UV irradiation device (brand name: Eye Ultraviolet Curing Apparatus, manufactured by Eyegraphics Co., Ltd.). The surface of the cured product following UV irradiation was then inspected visually. If absolutely no deterioration of the cured product surface was noticeable, the UV resistance was evaluated as "good", and was recorded as A, if some deterioration was noticeable, an evaluation of "some deterioration" was recorded as B, and if significant deterioration was noticeable, an evaluation of "deterioration" was recorded as C.

—4. Thermal Resistance—

Each of the prepared compositions was placed in a Teflon (registered trademark) coated mold of dimensions 50 mm×50 mm×2 mm, subsequently subjected to step curing at 80° C. for 1 hour, 150° C. for 1 hour, and 200° C. for 1 hour, and then post-cured for 8 hours at 200° C., thus yielding a cured film of thickness 1 mm. This cured film was then placed in an oven at 250° C., and the residual weight reduction ratio (%) was measured after 500 hours in the oven. This residual weight reduction ratio was recorded as the thermal resistance (%). Furthermore, in those cases where preparation of the cured film was impossible, the result was recorded in the table as x.

TABLE 1

| | | Example | | | | | |
|---|---|---|---|---|---|---|---|
| | | 1 | 2 | 3 | 4 | 5 | 6 |
| (i) | Polymer 1 | 10(5) | | | 10(5) | 10(5) | |
| | Polymer 2 | | 10(5) | | | | |
| | Polymer 3 | | | 10(5) | | | |
| | Polymer 4 | | | | | | 10(5) |
| (ii) | Catalyst 1 | 0.02 | 0.02 | 0.02 | | | 0.02 |
| | Catalyst 2 | | | | 0.02 | | |
| | Catalyst 3 | | | | | 0.02 | |
| Methyl group content (%)* | | 26.0 | 31.5 | 25.1 | 26.0 | 26.0 | 26.0 |
| Weight average molecular weight | | 21,000 | 8,500 | 120,000 | 21,000 | 21,000 | 20,500 |
| Crack resistance | | A | A | A | A | A | A |
| Adhesion | | 100/100 | 100/100 | 100/100 | 100/100 | 100/100 | 100/100 |
| UV irradiation resistance test | | A | A | A | A | A | A |
| Thermal resistance (%) | | 98 | 95 | 99 | 98 | 98 | 98 |

(Units: parts by mass)
Component (i)
The numbers within parentheses in the table represent the blend quantity (parts by mass) of the organopolysiloxane with the volatile fraction removed.
Component (ii)
Catalyst 1: zinc octoate
Catalyst 2: aluminum butoxy-bis(ethylacetoacetate)
Catalyst 3: tetrabutyl titanate
Composition
*Methyl group content: theoretical quantity of methyl groups within the polysiloxane.

TABLE 2

| | | Comparative Example | | | |
|---|---|---|---|---|---|
| | | 1 | 2 | 3 | 4 |
| (i) | Polymer C1 | 10(5) | | | |
| | Polymer C2 | | 10(5) | | |
| | Polymer C3 | | | 10(5) | |
| | Polymer C4 | | | | 10(5) |
| (ii) | Catalyst 1 | 0.02 | 0.02 | 0.02 | 0.02 |
| Methyl group content (%)* | | 40.5 | 22.4 | 26.0 | 6.7 |
| Weight average molecular weight | | 15,000 | 22,500 | 2,700 | 13,800 |
| Crack resistance | | A | B | B | A |
| Adhesion | | 50/100 | x | x | 60/100 |
| UV irradiation resistance test | | B | A | A | C |
| Thermal resistance (%) | | 85 | x | x | 93 |

(Units: parts by mass)
Component (i)
The numbers within parentheses in the table represent the blend quantity (parts by mass) of the organopolysiloxane with the volatile fraction removed.
Component (ii)
Catalyst 1: zinc octoate
Composition
*Methyl group content: theoretical quantity of methyl groups within the polysiloxane.

Evaluations

As is evident from Table 1, the resin compositions used in the present invention can be cured to form thick-film cured products, and display good levels of adhesion, crack resistance, UV irradiation resistance, and thermal resistance, and thus are suited for sealing light-emitting elements, such as LED elements.

Examples 7 to 10

In each of the following Examples, a surface mounted light emitting device such as that shown in FIG. 1 and FIG. 2 was produced. An LED chip such as that described below was used as the light emitting element 101.

(1) Production of LED Chip

The LED chip that was used was produced by laminating a GaN layer of an undoped nitride semiconductor, a Si-doped n-type GaN layer that represents an n-type contact layer with an n-type electrode formed thereon, and a GaN layer of an undoped nitride semiconductor on top of a sapphire substrate that functions as the translucent substrate, and subsequently forming an active layer by laminating 5 sets on top of the laminate, wherein each set comprises a GaN layer as a barrier layer and an InGaN layer as a well layer, and then finally laminating a GaN layer as a barrier layer on top of the 5 sets of layers. The active layer has a multi-quantum well structure. The active layer was formed by flowing TMG (trimethyl gallium) gas, TMI (trimethyl indium) gas, nitrogen gas, and a dopant gas, together with a carrier gas onto the surface of a cleaned sapphire substrate, and using a MOCVD method to form a film of the nitride semiconductor. By switching the dopant gas from $SiH_4$ to $Cp_2Mg$, n-type semiconductor layers and p-type semiconductor layers were formed. In addition, an AlGaN layer as a Mg-doped p-type cladding layer, and a p-type GaN layer that represents a Mg-doped p-type contact layer were laminated sequentially on top of the active layer. The GaN layer was formed on the surface of the sapphire substrate at low temperature and functions as a buffer layer.

Furthermore, the p-type semiconductor was annealed at a temperature of at least 400° C. following film formation. An LED chip prepared in this manner is a nitride semiconductor element with an active layer containing an $In_{0.2}Ga_{0.8}N$ semiconductor with a monochromatic emission peak of visible light at a wavelength of 455 nm.

Etching is used to expose the surfaces of the p-type contact layer and the n-type contact layer on the same surface of the nitride semiconductor on the sapphire substrate. Sputtering using ITO (a compound oxide of indium and tin) as the sputtering material is then conducted on top of the p-type contact layer, thereby providing a striped diffusion electrode across substantially the entire surface of the p-type contact layer. By using this type of electrode, the current flowing through the diffusion electrode is spread out across a wide area of the p-type contact layer, enabling the light emission efficiency of the LED chip to be improved.

In addition, sputtering using Rh/Pt/Au and W/Pt/Au is conducted sequentially on the p-side diffusion electrode and a portion of the n-type contact layer respectively, thereby forming metal layers that function as the p-side seat electrode and the n-side seat electrode. Finally, the wafer comprising the laminated semiconductors and formed electrodes is converted to chips by a dicing process, forming LED chips of dimensions 1 mm×1 mm. In these Examples, the n-type seat electrode, which is formed on the n-type semiconductor that is exposed in a striped pattern, is exposed through the insulating protective film ($SiO_2$) at two opposing edges on top of the LED chip. Furthermore, when viewed from above the LED chip, the n-type semiconductor exposed by the etching process has narrow constricted portions that extend from the corner portions where the n-type seat electrode is exposed towards the center of the LED chip. Furthermore, the n-type semiconductor also has an elongated portion that links this opposing pair of constricted portions. Moreover, the p-side semiconductor layer and diffusion electrode are positioned so as to sandwich this elongated portion, or alternatively, the p-side seat electrode is exposed through the protective layer.

(2) Eutectic Bonding and Electrical Connection to Package

As shown in FIG. 1 and FIG. 2, a package 105 comprising an almost entirely flat kovar substrate with a recessed portion in the center was used as the package. In this package 105, kovar lead electrodes 102 are positioned so as to sandwich the central recessed portion, and are inserted and secured in an airtight and insulated manner in two opposing positions at the outside edges of the recessed portion. A Ni/Ag layer is provided on the surface of the package 105 and the lead electrodes 102.

The lower surface of a LED chip 101 produced in the manner described above was metallized with aluminum, and was then eutectic bonded inside the recessed portion of the above package 105 using a gold-Sb alloy (weight ratio 8:2).

Subsequently, each of the electrodes of the die bonded light emitting element 101 and each of the exposed lead electrodes 102 exposed through the package 105 were connected electrically using Au wire 104.

(3) Preparation of the Phosphor

A coprecipitated oxide, obtained by using oxalic acid to coprecipitate a solution comprising the rare earth elements Y, Gd, and Ce dissolved in a stoichiometric ratio within an acid and then firing the thus formed coprecipitate, is mixed with aluminum oxide, yielding a raw material mixture. A suitable quantity of barium fluoride is then mixed into the raw material as a flux, the mixture is placed in a crucible and fired in air at a temperature of 1400° C. for a period of 3 hours to form a calcined product. This calcined product is subsequently ball-milled in water, and then washed, separated, dried and finally passed through a sieve to complete the formation of a $(Y_{0.995}Gd_{0.005})_{2.750}Al_5O_{12}:Ce_{0.250}$ phosphor (a so-called YAG phosphor) with a central particle diameter of 8 μm.

(4) Base Composition for Dropwise Addition

The compositions A and B described below were prepared as base compositions.

<Composition A>

The same composition as that according to the aforementioned Example 1, with the exception of not adding the zinc octylate (the condensation catalyst) of the component (ii).

<Composition B>

The composition obtained by adding an alkoxysilane-based coupling agent to the composition A.

Example 7

(Preparation of a White Light Emitting Device 1)

5 g of the base composition A and 5 g of the aforementioned YAG phosphor were weighed into a predetermined container, and were then mixed by stirring for three minutes and then defoamed for one minute. 0.5 g of zinc octylate was then added as a catalyst, and the mixture was once again stirred for three minutes and then defoamed for one minute. This process yielded a phosphor-containing silicone resin paste.

The above phosphor-containing silicone resin paste was then applied by potting to the top of the light emitting element that had been mounted to the package by gold-tin alloy eutectic bonding, thereby covering the light emitting element, and was then molded to the desired shape. The molded product was subjected to low temperature curing at 80° C. for one hour, followed by heat curing at 150° C. for one hour, and then further heat curing at 200° C. for 8 hours.

Subsequently, any moisture was thoroughly removed from inside the recessed portion of the package, a kovar lid 106 with a glass window portion 107 in the center was used to seal the package under an atmosphere of nitrogen, and the package was then sealed by hermetic sealing, thus yielding a white light emitting device 1.

When the thus obtained light emitting device was lit, white light was emitted with high luminance.

Example 8

(Preparation of a White Light Emitting Device 2)

With the exception of using the base composition B instead of the base composition A, a white light emitting device 2 was prepared in the same manner as Example 1.

Example 9

(Preparation of a Light Emitting Device 3)

With the exception of not adding the YAG phosphor to the base composition A, a light emitting device 3 was prepared in the same manner as Example 1.

Example 10

(Preparation of a Light Emitting Device 4)

With the exception of not adding the YAG phosphor to the base composition B, a light emitting device 4 was prepared in the same manner as Example 2.

—Reliability Test—

Four test samples of each of the light emitting devices 1 to 4 were prepared, and these samples were subjected to an operational test at 700 mA under conditions including a temperature of 23 to 25° C. and a humidity of 40 to 50%. The Tj value during operation was approximately 160° C.

The variation in output was measured for a period of 1000 hours, which yielded the results shown in FIG. 3, FIG. 4, FIG. 5, and FIG. 6 respectively. In all of Examples, the output retention rate after 1000 hours was at least 94%.

What is claimed is:

1. A light emitting device comprising:
   a light emitting element,
   a package comprised at least partially of metal on which said light emitting element is mounted, and
   a resin layer coated on said light emitting element, wherein said light emitting element is eutectic bonded to a metal portion of said package, and said resin layer comprises a cured product of a composition comprising:

(i) an organopolysiloxane with a polystyrene equivalent weight average molecular weight of at least $5\times10^3$, represented by an average composition formula (1):

$$R^1_a(OX)_b SiO_{(4-a-b)/2} \qquad (1)$$

wherein each $R^1$ represents, independently, an alkyl group, alkenyl group or aryl group of 1 to 6 carbon atoms, each X represents, independently, a hydrogen atom, or an alkyl group, alkenyl group, alkoxyalkyl group or acyl group of 1 to 6 carbon atoms, a represents a number within a range from 1.05 to 1.5, b represents a number that satisfies $0<b<2$, and $1.05<a+b<2$, and (ii) a condensation catalyst.

2. The light emitting device according to claim 1, wherein said resin layer contains a phosphor.

3. The light emitting device according to claim 1, wherein said light emitting element has a light emission peak wavelength within a range from 360 nm to 550 nm.

4. The light emitting device according to claim 1, wherein said $R^1$ groups are methyl groups.

5. The light emitting device according to claim 4, wherein a proportion of methyl groups within said organopolysiloxane is no more than 32% by mass.

6. The light emitting device according to claim 1, wherein said organopolysiloxane is dissolved in an organic solvent with a boiling point of at least 64° C., and a concentration of said organopolysiloxane is at least 30% by mass.

* * * * *